(12) United States Patent
Koren et al.

(10) Patent No.: US 7,356,058 B2
(45) Date of Patent: Apr. 8, 2008

(54) ADAPTIVE LASER DIODE DRIVER AND METHOD

(75) Inventors: Asaf Koren, Herzliya (IL); Offer Schwartsglass, Abu Gosh (IL)

(73) Assignee: Broadlight Ltd. (IL)

( * ) Notice: Subject to any disclaimer, the term of this patent is extended or adjusted under 35 U.S.C. 154(b) by 208 days.

(21) Appl. No.: 11/319,776

(22) Filed: Dec. 29, 2005

(65) Prior Publication Data

US 2007/0153849 A1   Jul. 5, 2007

(51) Int. Cl.
*H01S 3/00* (2006.01)

(52) U.S. Cl. ............................. 372/38.01; 372/38.02; 372/38.07

(58) Field of Classification Search ............ 372/38.01, 372/38.02, 38.07
See application file for complete search history.

(56) References Cited

U.S. PATENT DOCUMENTS

| | | | |
|---|---|---|---|
| 6,810,213 B2 | 10/2004 | Tonehira et al. | |
| 6,891,866 B2* | 5/2005 | Robinson et al. | 372/29.015 |
| 6,917,639 B2 | 7/2005 | Ishida et al. | |
| 7,142,574 B2* | 11/2006 | Asuri et al. | 372/38.02 |
| 2002/0093714 A1* | 7/2002 | Tokita et al. | 359/187 |
| 2003/0030873 A1* | 2/2003 | Hietala et al. | 359/181 |
| 2004/0258114 A1* | 12/2004 | Murata et al. | 372/38.02 |
| 2005/0238072 A1* | 10/2005 | Uesaka | 372/38.02 |

* cited by examiner

*Primary Examiner*—Minsun Oh Harvey
*Assistant Examiner*—Yuanda Zhang
(74) *Attorney, Agent, or Firm*—Browdy & Neimark

(57) ABSTRACT

An adaptive laser diode driver capable of driving various laser diode types as well different laser diodes from the same type, while ensuring optimal optical performance over the lifetime and temperature change of the diode. The driver adaptively changes the voltage level of input data signals to achieve full current switching as well as short rise time ($t_r$) and fall time ($t_f$) in extreme modulation conditions. This is preformed by constantly monitoring the output signal of a laser diode. Based on the monitored signal a modulation current is adjusted and in response the low level and high level of the input data signals are set. In accordance with one embodiment, the adaptive laser diode driver can be integrated in an optical line terminal (OLT) or an optical network unit (ONU) of a passive optical network (PON).

17 Claims, 5 Drawing Sheets

ADAPTIVE LASER DIODE DRIVER AND METHOD

FIELD OF THE INVENTION

The present invention relates to laser diode drivers.

REFERENCES CITED

| U.S. 2003/0030873 | Hietala, et al. | February 2003 |
| U.S. 2004/0258114 | Kazuhiko, et al. | December 2004 |
| U.S. Pat. No. 6,810,213 | Tonehira, et al. | October 2004 |
| U.S. Pat. No. 6,917,639 | Ishida, et al. | July 2005 |

BACKGROUND OF THE INVENTION

Recent growth in the demand for economical and high traffic volume optical fiber communication systems has encouraged the development of small, high-speed, and low-cost optical modules. For this reason, there is an on-going effort to provide improvements in the integrated circuit (IC) that drives and controls laser diodes optical power. This would allow smaller optical modules that are capable of functioning with smaller input signals.

FIG. 1 shows a conventional laser diode driver 100. The laser diode driver 100 is in the form of a field effect transistor (FET) differential pair configuration. The laser diode driver 100 includes a first transistor 110 and a second transistor 112 having their respective drain nodes coupled and modulated by a current source 120 having a current Imod. Each of the respective collector nodes of the first transistor 110 and the second transistor 112 is connected to a high reference supply voltage (Vcc) through resistors 130 and 132 respectively. The laser diode driver drives a laser diode 150 the output signal of which is monitored by a photodiode 160.

During operation, differential input data signals (IN+ and IN−) are provided from a pre-driver amplifier 180 to the respective gate nodes of the first and second transistors 110 and 112 respectively. The current $I_{MOD}$ provided by the current source 120 is typically modulated in synchronization with the voltage waveform of the input data signal. In response to the differential IN+ and IN− signals, the differential pair configuration acts as a differential amplifier that provides a modulated output signal from the collector node of the second transistor 112 to the laser diode 150. As a result, the laser diode 150 generates an optical output data signal that is representative of the differential IN+ and IN− signals. In addition, during operation, a current source 122 delivers a continuous fixed bias current $I_{BIAS}$ to the laser diode 150. This is usually necessary to ensure proper laser dynamic performance and is commonly termed the "pre-bias" current.

In some applications the laser diode driver 100 has to address different conditions at one fell swoop. One example of such an application is a burst mode transmitter installed in the optical network units (ONUs) of a passive optical network (PON). Such a transmitter should be able to operate over a wide temperature range and support high speed bit rate as well as high sensitivity to current changes. To satisfy the above conditions by the laser diode driver 100, the current of the output drive signal is typically required to be at a high level to properly drive the laser diode 150. Furthermore, the rise time ($t_r$) and fall time ($t_f$) of the waveform transitions of the modulated output drive signal should be very short (an order of several tens of picoseconds). The tradeoff for satisfying these conditions is the disability to provide a wide dynamic range for current sources 120 and 122 for varied values of $I_{MOD}$ and $I_{BIAS}$ as well as the existence of overshot signals. Moreover, it is known that the relationship between the driver's 100 output signal and the optical output of the laser diode 150 changes significantly with the environmental temperature as well as between different laser diode types and even with the same laser type but different components.

It would be, therefore, advantageous to provide a solution that would enable the efficient and stable operation of laser diode drivers.

SUMMARY OF THE INVENTION

This object is realized in accordance with one aspect of the invention by a method for improving optical performance of a laser diode by adaptively controlling a laser diode driver that drives said laser diode, said method comprising:

adjusting a replica modulation current to achieve full current switching in a replica amplifier that simulates conditions that allow full current switching in the laser diode driver;

monitoring a voltage amplitude level of a signal that drives said replica amplifier; and using the monitored voltage amplitude level to adaptively adjust a low level voltage and a high level voltage of an input signal to said laser diode driver In accordance with another aspect of the invention, there is provided a laser diode driver circuit for improving optical performance of a laser diode, said circuit comprising:

a pre-driver amplifier for generating input signals;

a laser diode driver having an input coupled to the pre-driver amplifier and being responsive to said input signals for driving said laser diode; and a replica amplifier coupled to the laser diode driver for simulating conditions that allow full current switching in the laser diode driver and being responsive to a monitored voltage amplitude level of a signal that drives said replica amplifier for adaptively changing a low level voltage and a high voltage level of the input signals.

BRIEF DESCRIPTION OF THE DRAWINGS

In order to understand the invention and to see how it may be carried out in practice, some embodiments will now be described, by way of non-limiting example only, with reference to the accompanying drawings, in which.

DETAILED DESCRIPTION OF EXEMPLARY EMBODIMENTS

The present invention discloses a laser diode driver and method thereof. The laser diode driver is capable of driving various laser diode types and various laser diodes of similar type, while ensuring optimal optical performance over the lifetime and temperature change of the diode. The driver adaptively changes the voltage level of the input signals to achieve full current switching as well as short rise time ($t_r$) and fall time ($t_f$) in extreme modulation conditions. In accordance with an embodiment of the present invention, the short rise and fall times achieved are in the order of picoseconds. This is achieved by constantly monitoring the output signal of a laser diode, and based on the signal adjusting the voltage levels of the input signals.

Figure 1:
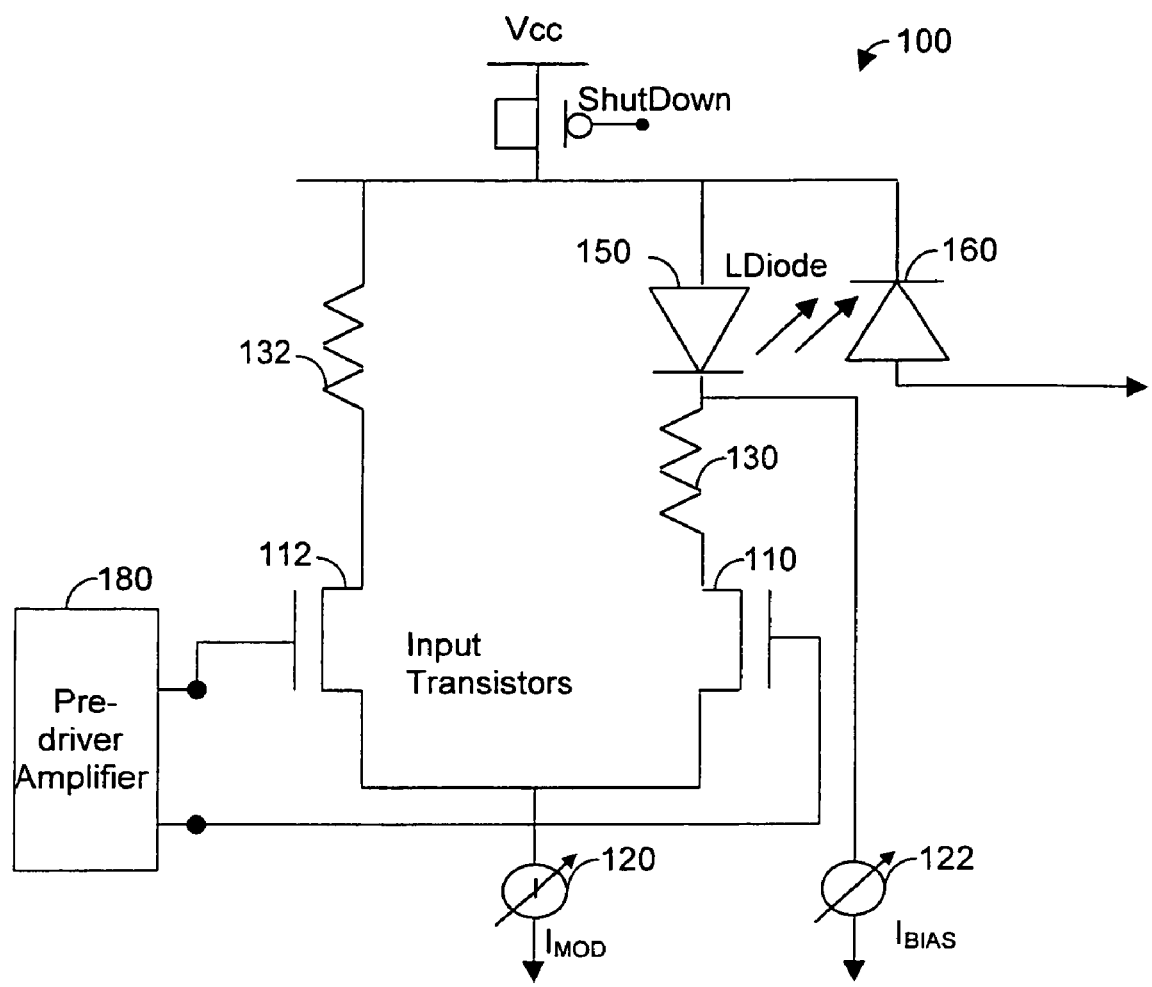
FIG. 1 is a schematic diagram of a typical prior art laser diode driver.
Figure 2:
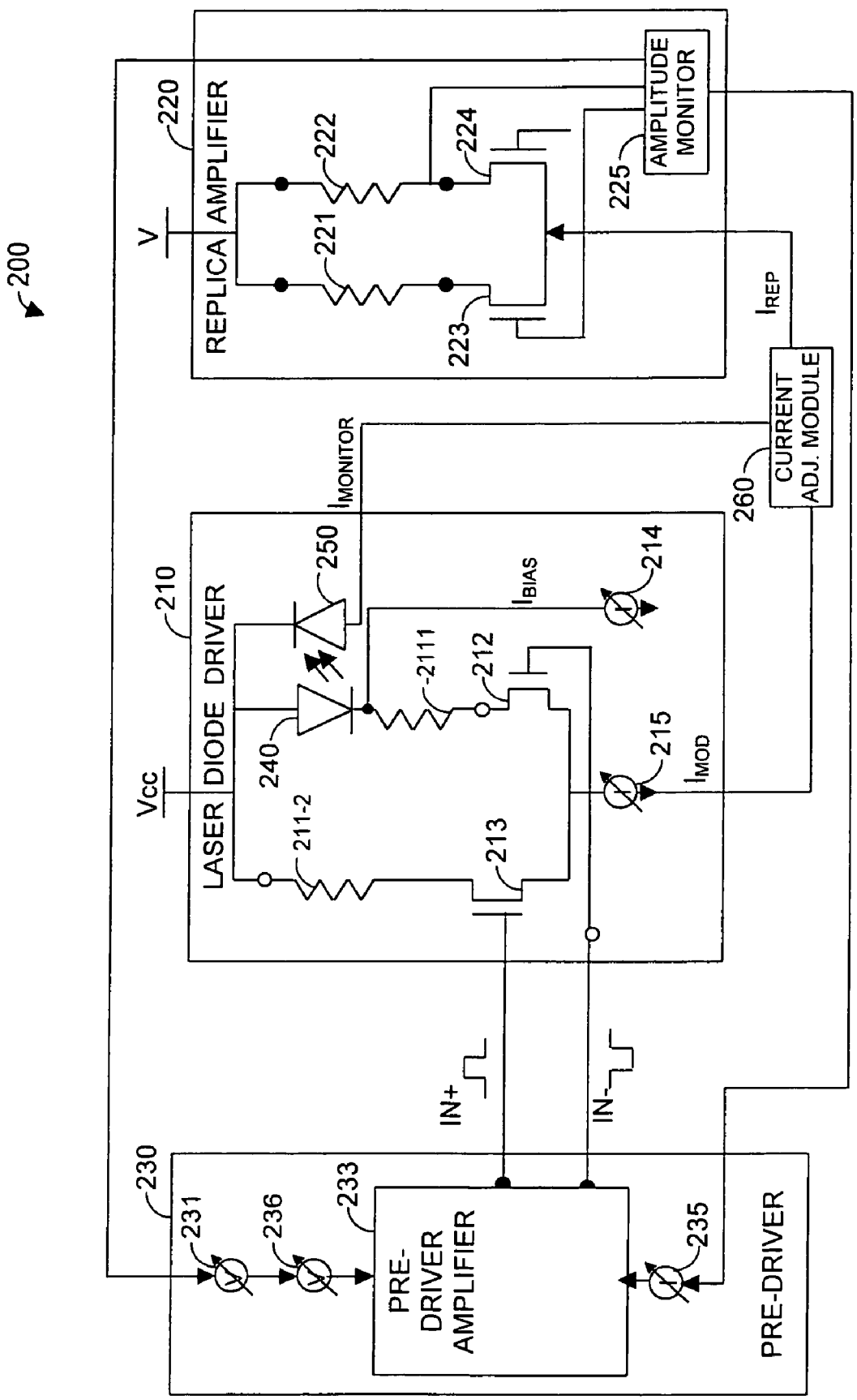
FIG. 2 is a schematic circuit diagram of a laser diode driver and a replica amplifier according to a first embodiment of the present invention.

FIG. 2 shows a non-limiting and exemplary diagram of a laser diode driver circuit 200 implemented in accordance with the principles of the present invention. The circuit 200 includes a laser diode driver 210, a replica amplifier 220, a pre-driver circuit 230, a laser diode 240, and a photodiode 250. The laser diode driver 210 includes two resistors 211-1 and 211-2 connected to transistors 212 and 213 respectively, a bias current source 214 that produces a current $I_{BIAS}$ and a modulation current source 215 that produces a current $I_{MOD}$. The operation of these components is as described in greater detail above. The laser diode 240 produces optical signals based on the output signals provided by the laser diode driver 210. The laser diode 240 may be, but is not limited to, a Fabry-Perot (FP) laser, a distributed feedback (DFB) laser, and the likes. The photodiode 250 produces current ($I_{MONITOR}$) in proportion to the amount of light emitted by laser diode 240. $I_{MONITOR}$ is provided as an input to a current adjustment module 260, which sets the level of the modulation current ($I_{MOD}$) of the current source 215 based on the level of $I_{MONITOR}$.

The replica amplifier 220 is a differential amplifier that to some extent replicates the laser diode driver 210. The purpose of the replica amplifier 220 is to simulate conditions that allow full current switching in the amplifier 220, and hence in the laser diode driver 210. The replica amplifier 220 includes resistors 221 and 222 that are respectively connected to transistors 223 and 224, which are commonly connected to the current adjustment module 260. The current ($I_{REF}$) supplied by the current adjustment module 260 is reduced proportionally to the current $I_{MONITOR}$ produced by the photodiode 250. The replica amplifier 220 further includes an amplitude monitor 225 that monitors the voltage amplitude that drives the replica amplifier 220. The voltage levels measured by the amplitude monitor 225 are provided as input to a voltage regulator 231 within the pre-driver circuit 230.

The pre-driver circuit 230 further includes a pre-driver amplifier 233, a current source 235 and a power supply 236 whose output voltage is regulated by the voltage regulator 231 to which it is coupled. The pre-driver amplifier 233 is a differential amplifier that generates the IN+ and IN− signals. The power supplied by the power supply 236 is controlled by the voltage regulator 231. Generally, a voltage regulator operates by using a voltage-controlled current source to force a fixed voltage to appear at the regulator output. The voltage regulator 231 adjusts the power supply 236 according to an input from the replica amplifier 220. The voltage supplied by the power supply 236 determines the high voltage level of the input signals, IN+ and IN−. The current source 235 is adjusted to set the low level of the IN+ and IN− signals according to an input from the replica amplifier 220.

The input provided by the replica amplifier 220 is the amplitude signal that drives the replica amplifier 220 and allows for full current switching. This amplitude is measured by the replica amplifier 220 as will be described in greater detail below. In accordance with one embodiment of the present invention the diode driver circuit 200 is implemented using a complementary metal oxide semi-conductor (CMOS) process.

Figure 3:
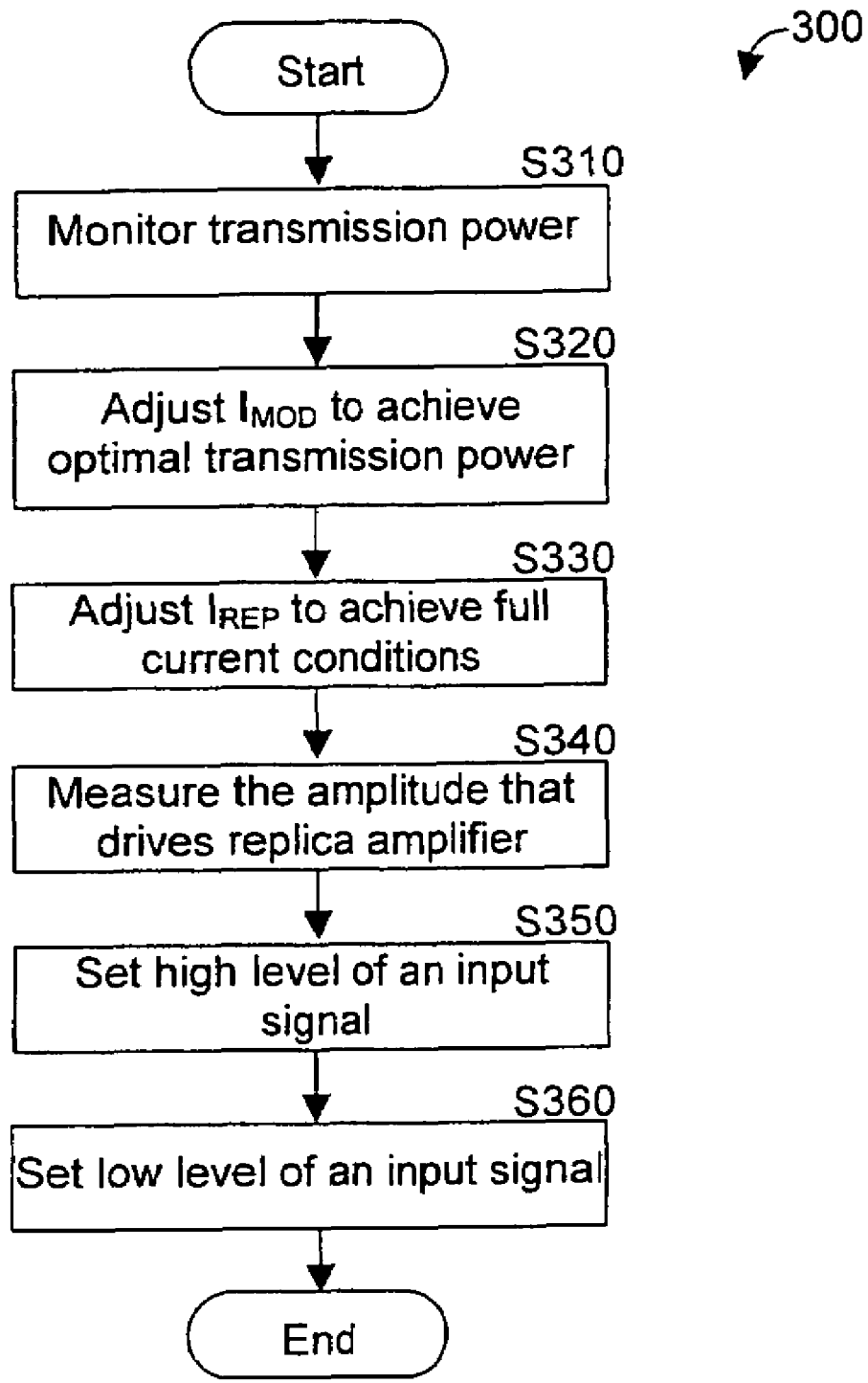
FIG. 3 is a flowchart describing the method for adaptively changing the driving amplitude of a laser diode driver in accordance with the present invention.

FIG. 3 shows a non-limiting and exemplary flowchart 300 describing a method for adaptively changing the driving amplitude of a laser diode driver, in accordance with an embodiment of the present invention. The method adaptively controls the low and high levels of the input signals IN+ and IN− to allow full current switching in extreme current modulation conditions. The method may be operated on circuit 200 described in more detail above.

At S310, the optical output power of the laser diode 240 is monitored by the photodiode 250, which in response generates the current $I_{MONITOR}$. The optical power output, or the light illuminated, by the laser diode 240 is a function of at least the bias current $I_{BIAS}$ and the modulation current $I_{MOD}$. At S320, using the current $I_{MONITOR}$ the current $I_{MOD}$ is adjusted to achieve optimum transmission power of the laser diode 240. This may be performed by means of the current adjustment module 260. At S330, once the modulation current $I_{MOD}$ is set to achieve optimum transmission power, $I_{MOD}$ is then scaled down by a predefined factor using the adjustment module 260. For example, if the modulation current $I_{MOD}$ is 1 mA, then it can be reduced by a factor of 100. The scaled down current (hereinafter "$I_{REF}$") is the modulation current of the replica amplifier 220. At S330, the current that modulates the replica amplifier 220 "$I_{REF}$" is adjusted to achieve full current switching. In a full current switching condition the current in each branch should be either zero or equal to a last value of $I_{REF}$ and the output signal has a duty cycle of 50 percent. At S340, once full current switching is accomplished, the amplitude that drives the replica amplifier 220 is monitored by the amplitude monitor 225. The minimum and peak levels of the amplitude are inputs of the pre-driver circuit 230. At S350, the voltage of power supply 236 is set to the peak value of the amplitude measured at S340. This is performed by regulating the output power supply 236 using voltage regulator 231 until the desired level is achieved. The power supply 236 determines the high level of the input signals IN+ and IN−. At S360, the current source 235 is adjusted to set the low level of the signals IN+ and IN− according to an input from the replica amplifier 220. This input comprises the minimum value of the amplitude measured at S340 plus a predetermined voltage threshold ΔV. The low voltage determines the low level of the input data signals IN− generated by the pre-drive amplifier 233.

Figure 4A:
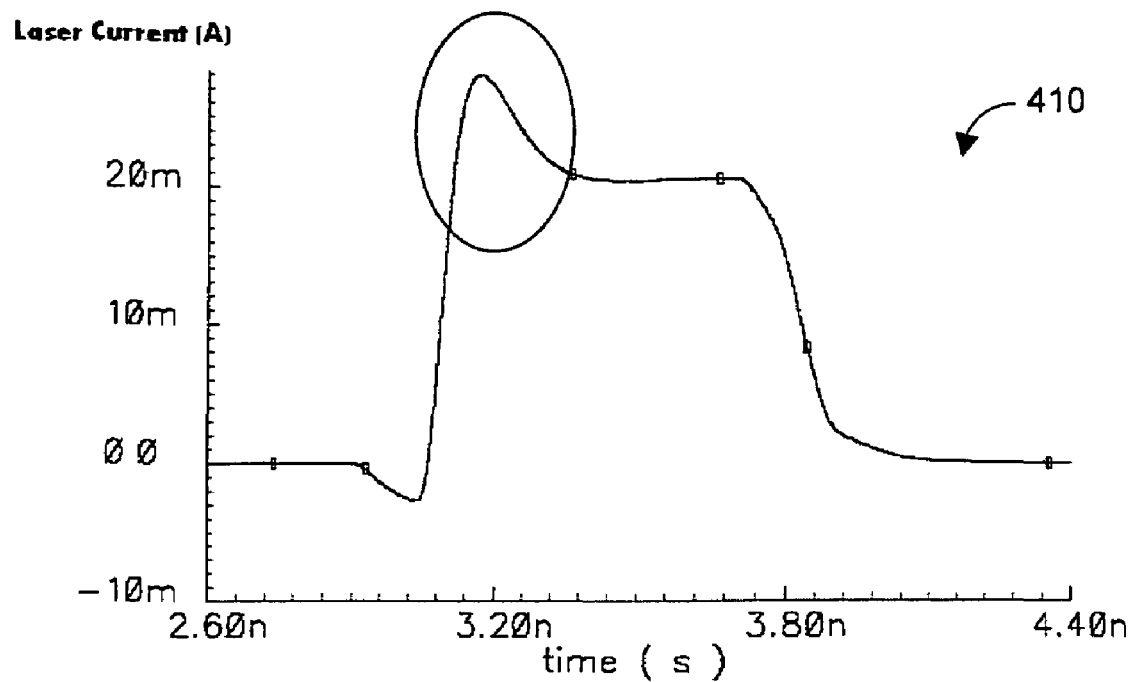
FIGS. 4a and 4b are exemplary graphs depicting respective reductions of overshoot signals using a prior art laser diode driver and a laser diode driver according to the invention.
Figure 4B:
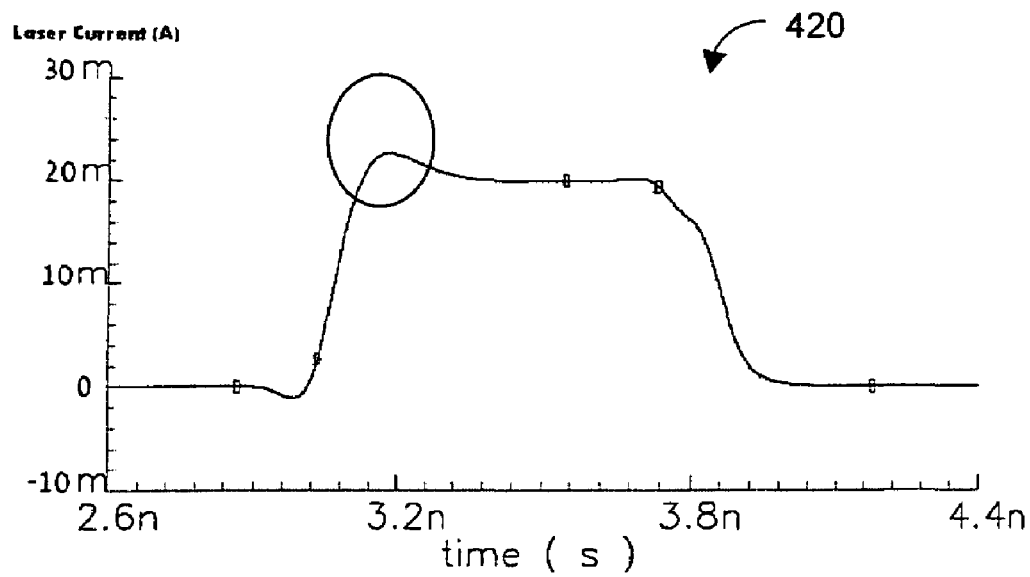

It will be appreciated by a person skilled in the art that the method disclosed herein can also reduce the overshoot, i.e., the increased amplitude of a portion of non-sinusoidal output signals produced by circuit 200. For example, FIGS. 4a and 4b depict respectively exemplary graphs of an output signal 410 produced by a laser diode drive without the utilizing the disclosed techniques and an output signal 420 produced by a laser diode driver that embodied the techniques of the present invention. As can be noted, the signal shown in graph 420 does not include the overshoot in comparison to the signal shown in graph 410.

Figure 5:
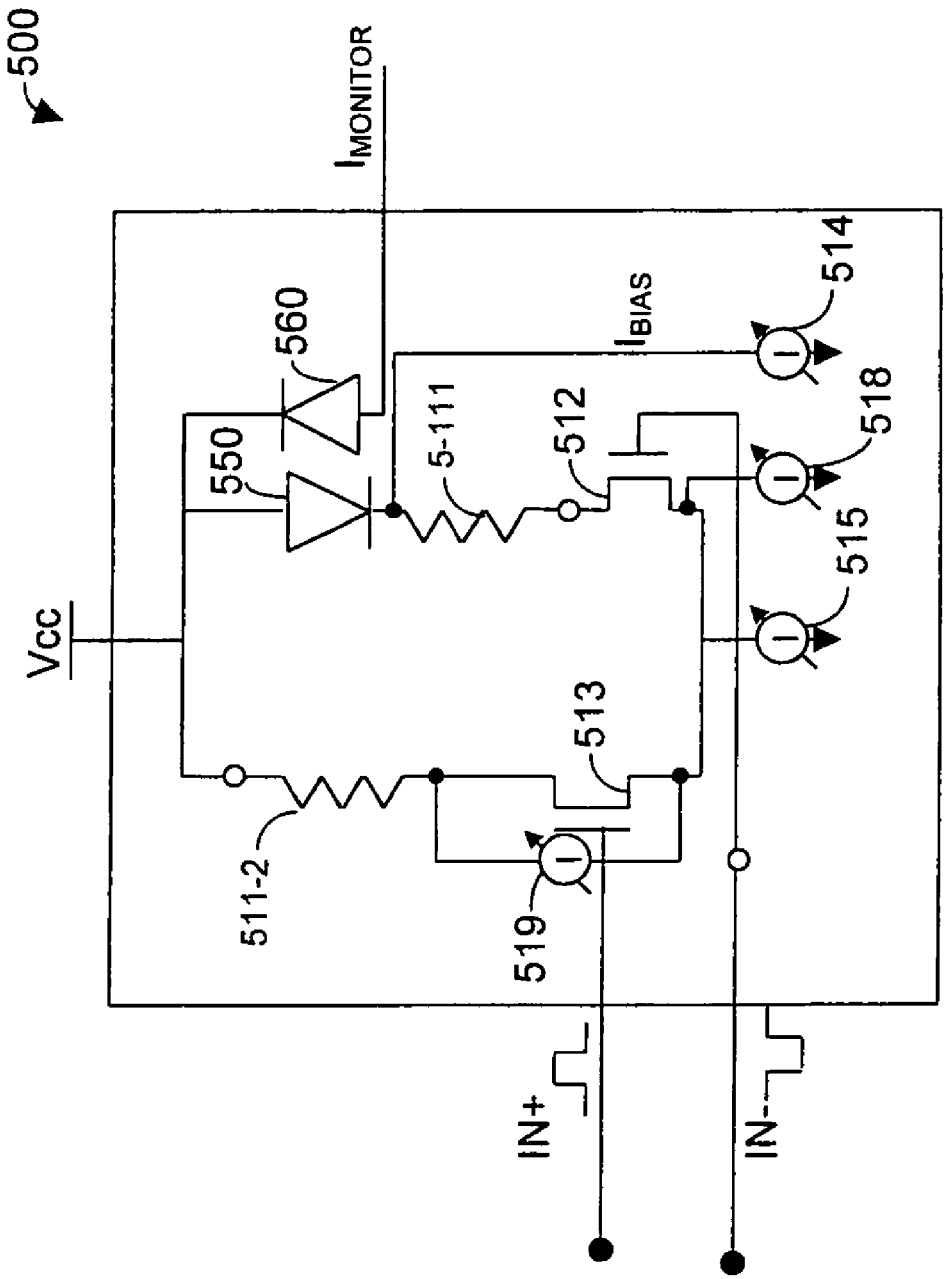
FIG. 5 is a schematic circuit diagram of a laser diode driver according to a second embodiment of the present invention.

FIG. 5 shows an exemplary and non-limiting diagram of laser diode driver circuit 500 according to another embodiment of the present invention. Circuit 500 includes standard electrical components of a laser diode driver, such as resistors 511-1 and 511-2 connected to transistors 512 and 513 respectively, a bias current source 514 and a modulation current source 515. The operation of these components is as described in greater detail above with reference to FIG. 3. In addition, in order to achieve short rise and fall times, the circuit 500 includes current sources 518 and 519. The current sources 518 and 519 can be safely added to the laser diode driver 500, as the output of the laser diode is not required to be symmetrical. Specifically, the current source 518 is connected to the source of the transistor 512 and is activated only in one polarity to boost the fall time. The current source 519 is coupled across the transistor 513, i.e. between its source and drain, and is always active to ease capacitive of the rise time. The current supplied by each of the current sources 518 or 519 is typically in the order of 15 mA. In accordance with one embodiment of the present invention the diode driver circuit is implemented using a CMOS process.

In accordance with one embodiment of the present invention, the laser diode driver circuit disclosed herein can operate as a burst mode laser driver for Gigabit PON (GPON), Ethernet PON (EPON), and broadband PON (BPON) ONU units. In addition, the disclosed circuit can be utilized in continuous transceivers to drive continuous mode laser diodes such as those installed in GPON, EPON, and BPON OLT units.

The invention claimed is:

1. A method for improving optical performance of a laser diode by adaptively controlling a laser diode driver that drives said laser diode, said method comprising:
   adjusting a replica modulation current to achieve full current switching in a replica amplifier that simulates conditions that allow full current switching in the laser diode driver;
   monitoring a voltage amplitude level of a signal that drives said replica amplifier;
   using the monitored voltage amplitude level to adaptively adjust a low level voltage by adjusting a current of an input current source in a pre-driver circuit and by adjusting said low level voltage to a minimum value of the monitored voltage amplitude plus a predetermined voltage threshold; and
   using the monitored voltage amplitude level to adaptively adjust a high level voltage of an input signal generated by said pre-driver circuit to said laser diode driver.

2. The method of claim 1, including adjusting a driver modulation current of said laser diode driver to achieve improved transmission power of the laser diode prior to adjusting said replica modulation current.

3. The method of claim 2, including modulating said replica amplifier with said replica modulation current.

4. The method of claim 2, including modulating said laser diode driver with said driver modulation current.

5. The method of claim 1, wherein adjusting said high level voltage of the input signal comprises regulating the power level of a power source in said pre-driver circuit.

6. The method of claim 1, wherein improving said optical performance includes achieving full current switching, a short rise time of an output signal, and a short fall time of an output signal.

7. The method of claim 6, wherein the short fall time and the short rise time are in the order of picoseconds.

8. The method of claim 6, wherein the laser diode is of a type included in the group consisting of: a Fabry-Perot (FP) laser, a distributed feedback (DEB) laser.

9. A laser diode driver circuit for improving optical performance of a laser diode, said circuit comprising:
   a pre-driver amplifier for generating input signals, said pre-driver including:
   a voltage regulator for setting the high voltage level of said input signal using the monitored voltage amplitude; and
   a current source for setting the low voltage level of said input signal to a minimum monitored voltage amplitude plus a predetermined voltage threshold;
   a laser diode driver having an input coupled to the pre-driver amplifier and being responsive to said input signals for driving said laser diode, said laser diode including:
   a photodiode for producing a monitor current responsive to an optical power level of the laser diode; and
   a current adjustment module for adjusting a replica modulation current of the replica amplifier, wherein the replica modulation current is reduced proportionally to the monitor current; and
   a replica amplifier coupled to the laser diode driver for simulating conditions that allow full current switching in the laser diode driver and being responsive to a monitored voltage amplitude level of a signal that drives said replica amplifier for adaptively changing a low level voltage and a high voltage level of the input signals, said replica amplifier including an amplitude monitor for monitoring a voltage amplitude level of a signal hat drives said replica amplifier.

10. The laser diode driver circuit of claim 9, wherein the replica amplifier adaptively changes the low voltage level and the high level voltage of the input signals so as to achieve full current switching, a short rise time of an output signal, and a short fall time of an output signal.

11. The laser diode driver circuit of claim 10, wherein the short fall time and the short rise time are in the order of picoseconds.

12. The circuit of claim 9, wherein the current adjustment module is adapted to adjust a driver modulation current of said laser diode driver to achieve improved transmission power of the laser diode prior to adjusting said replica modulation current.

13. The circuit of claim 9, being adapted to achieve said improved optical performance for any type of a laser diode and for any manufactured laser diode device.

14. The circuit of claim 13, wherein the laser diode is of a type included in the group consisting of: a Fabry-Perot (FP) laser, a distributed feedback (DFB) laser.

15. The circuit of claim 14, wherein the laser diode driver circuit operates as a burst mode laser driver in an optical network unit (ONU).

16. The circuit of claim 15, wherein said ONU is at least one of: a Gigabit PON (GPON) ONU, an Ethernet PON (EPON) ONU, a broadband PON (EPON) ONU.

17. A continuous transceiver including the circuit of claim 9 for driving continuous mode laser diodes.

* * * * *